United States Patent [19]
Gunderson

[11] Patent Number: 4,511,857
[45] Date of Patent: Apr. 16, 1985

[54] OUTPUT FOLLOWING INTERMEDIATE CASCODE CIRCUIT

[76] Inventor: Steven J. Gunderson, 450 Daily Dr., #6, Camarillo, Calif. 93010

[21] Appl. No.: 419,161

[22] Filed: Sep. 17, 1982

[51] Int. Cl.[3] .............................................. H03F 3/04
[52] U.S. Cl. ..................................... 330/311; 330/307
[58] Field of Search ................. 330/291, 311, 296, 307

[56] References Cited

FOREIGN PATENT DOCUMENTS 2724545  12/1978  Fed. Rep. of Germany ...... 330/311

OTHER PUBLICATIONS

"Feedback, Sensitivity, and Stability of Audio Power Amplifiers", by Edward M. Cherry, J. Audio Eng. Soc., vol. 30, No. 5, May, 1982, pp. 282–294.
"Nested Differentiating Feedback Loops in Simple Audio Power Amplifiers", by Edward M. Cherry, J. Audio Eng. Soc., vol. 30, No. 5, May 1982, pp. 295–305.
"Distortion Correction in Audio Power Amplifiers", by M. J. Hawksford, J. Audio Eng. Soc., vol. 29, No. 1/2, Jan./Feb., 1982, pp. 27–30.

Primary Examiner—James B. Mullins
Assistant Examiner—G. Wan
Attorney, Agent, or Firm—Freilich, Hornbaker, Rosen & Fernandez

[57] ABSTRACT

The input terminal (3) of a voltage-follower output stage (22) is isolated from its signal source (20, 21) by an output following intermediate cascode circuit (23) comprised of a transconductance amplifier which may take the form of a common-base transistor amplifier ($Q_{24}$) with its emitter connected to a terminal (1) at the output of the signal source, its base connected to the output terminal (2) of the voltage follower output stage, and its collector connected to the input terminal (3) of the voltage-follower output stage. The output following intermediate cascode circuit (OFICC) isolates the voltage signal at the input terminal (3) of the voltage-follower output stage from the signal source so that non-linearities in the output voltage of the voltage-follower output stage are not coupled back into the signal source.

10 Claims, 9 Drawing Figures

OUTPUT FOLLOWING INTERMEDIATE CASCODE CIRCUIT

BACKGROUND OF THE INVENTION

This invention relates to amplifiers, and more particularly to an output following cascode circuit placed between a voltage follower and an input signal source.

Most audio and operational amplifiers employ Miller-effect compensation for stabilization. In some circuits, Miller-effect compensation may not be readily apparent, but if internal device capacitances are taken into consideration some form of Miller-effect compensation is apparent. The Miller effect of a device is the increase in the effective base-to-collector capacitance of a transistor, or grid-to-cathode capacitance of a vacuum tube, because the collector, or plate, induces a charge on the base, or grid, through internal capacitance. This Miller effect may also be observed in field-effect transistors.

The advantage of Miller-effect compensation is that the pole in the response of the stage around which the compensation is present produces a zero at the same frequency in the Miller-effect impedance. This results in a single pole response, simplifying compensation. To take advantage of this compensation, additional capacitance is added between the collector and base of a transistor in audio power amplifiers and operational amplifiers, examples of which are analyzed by Edward M. Cherry in companion papers titled "Feedback, Sensitivity, and Stability of Audio Power Amplifiers" and "Nested Differentiating Feedback Loops in Simple Audio Power Amplifiers" published in the Journal of Audio Engineering Society, Vol. 30, No. 5, 1982.

A typical audio amplifier or operational amplifier is comprised of three stages: an input stage, an intermediate stage and an output stage. The input stage is a transconductance amplifier, sometimes with an active current sink. The intermediate stage is an inverting amplifier providing both current and voltage gain. It is usually the intermediate stage that is compensated by the Miller-effect capacitance, sometimes augmented by external capacitance, and an input or output lag capacitor. The output stage is a voltage follower providing the current required by the load. It has been discovered that over the frequency range of 1 to 100 KHz there is a significant distortion of about 0.2% or more in the output stage of a typical amplifier with a distortion for the whole amplifier increasing from about 0.003% to more than 0.2% as frequency increases.

The degree of distortion can be determined by assuming a sinusoidal voltage and current at the output, and computing the voltage and current, and the harmonics, at each node connecting the stages. By starting at the output and working towards the input, the required input voltage and current, and harmonics, can then be easily computed. The percentage of distortion can be computed by scaling these by the reciprocal of the feedback network's transfer function and comparing to the output voltage. This analysis ignores common mode rejection problems in the input stage and interaction with nonzero impedances connected to the input. Minimizing the input voltage swing by connecting the amplifier in an inverting configuration or by using cascode circuitry in the input can minimize common-mode nonlinearity problems.

In Cherry's study of the feedback, sensitivity and stability of audio power amplifiers (supra), three-dimensional distortion mechanisms are revealed: input stage transconductance nonlinearity, and limiting, resulting in transient intermodulation (TIM) distortion; output stage current nonlinearity; and output stage voltage nonlinearity. The effect of input stage nonlinearity can be minimized by reducing the ratio of the peak change in current to the static bias current. This is related to the slew rate of the amplifier.

The sensitivity of the amplifier to changes in output stage current and current gain shows strong dependence on the nominal current gain of the intermediate and output stages. The sensitivity of the amplifier to output current nonlinearities (such as are produced by loudspeakers operating near resonance) and to current gain nonlinearities can be arbitrarily reduced by increasing the current gain of the intermediate and output stages. MOSFETs used in power amplifiers require substantial currents to charge their internal device capacitances and produce a frequency-dependent current for these devices. Bipolar power transistors also require additional current at higher frequencies to charge their internal device capacitances.

According to Cherry, the sensitivity of the amplifier to changes in output stage transconductance or voltage nonlinearities is dependent on gain bandwidth product of the amplifier. The sensitivity of the amplifier to output voltage nonlinearities cannot be arbitrarily reduced because of the limitation of the gain bandwidth due to instability and oscillation. These output stage nonlinearities are found in both bipolar and MOSFET designs. The output device capacitances require currents to charge them to follow the nonlinear voltage and result in nonlinear currents. The effect of the currents can be reduced by increasing the nominal current gains of the intermediate and output stages.

These output stage nonlinearities will be coupled through the Miller compensation capacitors into the input stage. The compensation capacitors will differentiate the distorted voltage into currents and couple these in such a way as to affect the intermediate stage, and thus require the input stage to have a distorted voltage waveforms at its input.

Another capacitance commonly found in power amplifier designs is a high frequency bypass capacitor connecting the intermediate stage to the input stage. This capacitor helps stability by shunting the high frequencies directly to the input stage, bypassing the output stage and its pole. It also permits an optimum Miller compensation capacitor to be used. Unfortunately, this Miller compensation capacitor and the bypass capacitor are of such sizes that they couple nonlinearities in voltage from the output stage back to the input stage, and the Miller capacitor cannot be arbitrarily reduced without causing instability in the amplifier. The problem then is to reduce coupling of output voltage nonlinearities through the compensation and bypass capacitors to the input.

This problem can be solved in three ways: by effectively fooling the amplifier into thinking the gain-bandwidth product is greater than it is; move the compensation capacitors to the output of the output stage; and reduce the output stage nonlinearity itself. Cherry recommends using nested differentiating feedback loops as a solution. Such loops increase the apparent gain-bandwidth product at frequencies less than the actual cutoff frequency. Also the Miller compensation capacitor is connected between the input of the intermediate stage input and the output of the output stage. This reduces the effect of the output stage nonlinearity.

The topology recommended by Cherry is stable with resistive loads. However, it has two disadvantages: Miller-effect (internal device) capacitance in the intermediate stage is still present to produce some coupling of the output stage nonlinearity to the input stage, and a bypass capacitor from the intermediate stage to the input stage cannot be used to improve stability without further coupling the output stage nonlinearity to the input stage. The ultimate solution lies in reducing the output stage voltage nonlinearity, but that is sometimes difficult. It would be better to isolate the nonlinearities of the output stage from the intermediate stage, or whatever serves as the signal source for the output stage, in order not to couple nonlinearities in the output stage into the signal source.

SUMMARY OF THE INVENTION

In accordance with the present invention, a voltage-follower output stage is isolated from its signal source by an output following intermediate cascode circuit (OFICC) comprised of a common control-electrode amplifier with the control electrode connected to the output of the voltage follower, such as a transistor amplifier connected in a common base configuration with its emitter connected to a signal source, its collector connected to the input of the output stage and its base connected to the output of the output stage. The input signal source is thus isolated from the voltage nonlinearities of the output stage. In the case of an audio power amplifier, or operational amplifier, the intermediate stage drives the output stage through the OFICC. The intermediate stage may have Miller-effect capacitance, and perhaps additional capacitance, for compensation, and may have a high frequency bypass capacitor connected from the intermediate stage to the input stage for stabilization. The OFICC isolates the output stage from the intermediate stage so that these capacitances will not couple nonlinearities in the output voltage back to the input stage.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
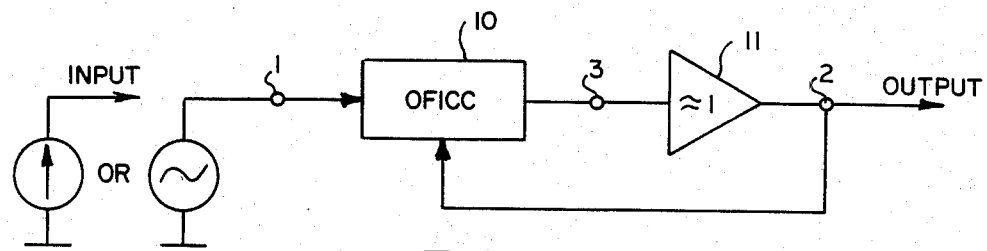
FIG. 1 is a block diagram of an OFICC uncoupling a voltage follower output stage from an input circuit in accordance with the present invention.

Referring now to FIG. 1, an output following intermediate cascode circuit (OFICC) 10 is shown in conjunction with a voltage follower 11 to effectively linearize the voltage transfer function of the voltage follower. The OFICC is used to couple the input signal (current or voltage) at terminal 1 to the voltage follower in order to isolate nonlinearities in the input voltage signal to the voltage follower 11 at terminal 3 from the input signal source at terminal 1. The control electrode of the OFICC is connected to the output terminal 2 of the voltage follower, and the output of the OFICC is connected to the input of the voltage follower at terminal 3.

Figure 2:
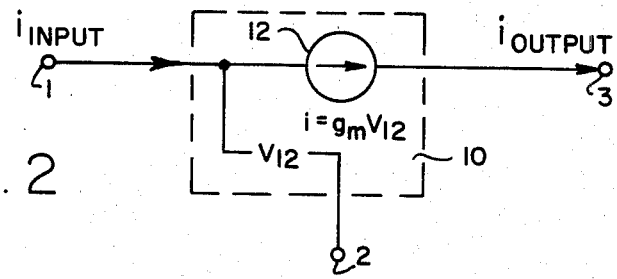
FIG. 2 is an internal model representation of the OFICC shown in FIG. 1.
Figure 3A:
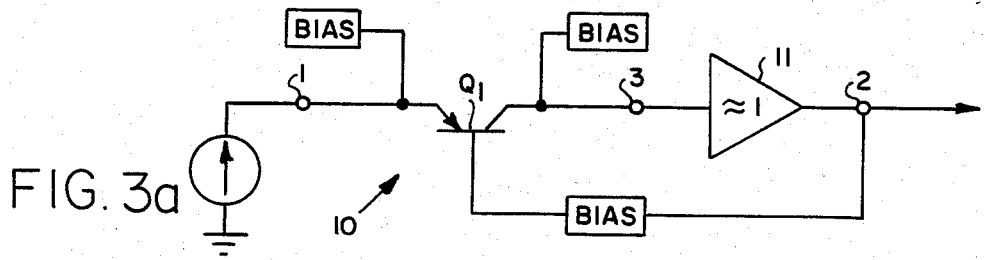
FIGS. 3a, b and c illustrate exemplary implementations of an OFICC.
Figure 3B:
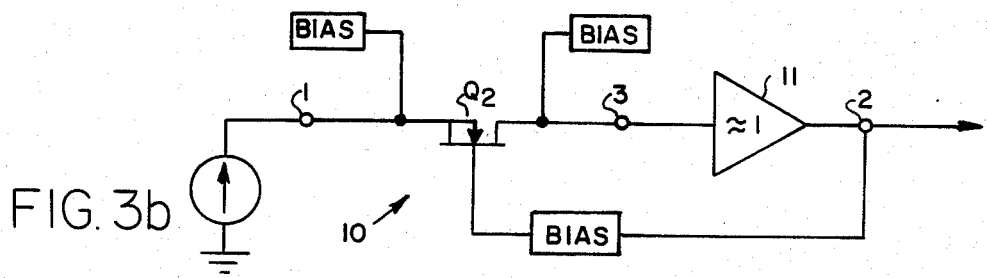
Figure 3C:
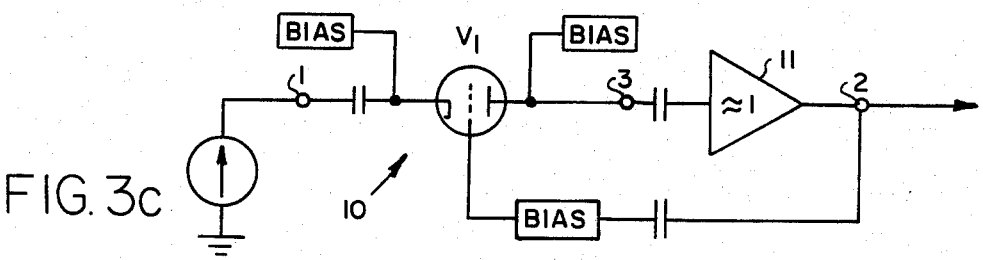

The internal model representation of the OFICC shown in FIG. 2 is a transconductance $g_m$ connected so that the input current equals the output current. The transconductance has a current, or voltage, signal source connected at terminal 1 and a reference voltage $V_{12}$ at terminal 2. The output voltage at terminal 3 is not related to the input voltage. The OFICC can be implemented as a common-base, common-gate or common-grid amplifier for a bipolar transistor $Q_1$ shown in FIG. 3a, a MOSFET $Q_2$ shown in FIG. 3b, or a vacuum tube $V_1$ shown in FIG. 3c. In each case, the bias network and coupling network connecting the output of the voltage follower at terminal 2 to the control electrode of the OFICC device must allow the control electrode to closely follow the output of the voltage follower for the frequency band of interest. Because of the higher bias voltage requirements of a vacuum tube, the OFICC is AC coupled with capacitors as shown in FIG. 3c. In the case of a bipolar transistor, or a MOSFET, DC coupling may be used. It would also be possible to use transformer coupling in all of these cases if desired for the environment of the OFICC.

Analysis of the operation of the OFICC will now be described for the case of a bipolar junction transistor shown in FIG. 3a assuming the voltage follower 11 has an input impedance, $X_i$, greater than the reciprocal of the OFICC's transconductance, $g_m^{-1}$. The signal source at the input terminal 1 may be a current source or a voltage source. Considering first the case of a current source input as shown, the OFICC causes the voltage at the input terminal 1 to closely follow the voltage at the output terminal 2 of the voltage follower (less only the voltage drop across the base-emitter junction of the transistor and offset by the transistor bias voltage). The OFICC may thus be considered to be a cascode amplifier with its reference connected to the output terminal 2. The ratio of the voltage $V_{12}$ between the input terminal 1 and the output terminal 2 to the voltage $V_3$ at the output terminal 3 of the OFICC is:

$$V_{12}/V_3 = 1/(X_i g_m)$$

This ratio $V_{12}/V_3$ is typically very small. For example, assuming $g_m = 10^{-2}$ mho for the bipolar transistor biased at 0.3 milliamps, and an input impedance $X_i$ for the voltage follower of 100K ohms, the ratio is $1 \times 10^{-3}$. Further assuming unity gain for the voltage follower such that the voltage $V_2$ at the output terminal 2 is equal to the voltage $V_3$ at terminal 3, this ratio $V_{12}/V_3$ demonstrates that the voltage output of the OFICC will closely follow the voltage output of the voltage follower. Any deviation in the transfer function of the voltage follower from unity will, of course, cause an error to develop across terminals 1 and 2, but such error will also be reduced by the ratio $V_{12}/V_3$, which is to say by the factor of $1 \times 10^{-3}$.

Considering next a voltage source at the input terminal 1, the OFICC causes the voltage of the output terminal 2 to closely follow the input terminal 1. (It should be noted that this is the reverse of the case for a current source at the input terminal 1.) The OFICC acts as a voltage amplifier with negative feedback. Operation can be analyzed the same way as the current source case with the same result: the output follows the input within the error voltage $V_{12}$ defined by the transconductance, $g_m$, the input impedance $X_i$, and the voltage at the input terminal 3 of the voltage follower 11.

The OFICC has no current gain, and for a bipolar junction transistor has a current gain of less than unity due to control current flowing through the base. Nevertheless, the collector current is very close to that required by the input of the voltage follower.

The purpose of an OFICC is to make the voltage signals at the input terminal 1 and the output terminal 2 closely equal to each other independently of the voltage required at the input terminal 3 of the voltage follower 11 to produce the voltage at the output terminal 2 of the voltage follower. This can be readily appreciated in the case of the bipolar junction transistor shown in FIG. 3a. The same result is achieved with a device which draws no control current, such as a field-effect transistor shown in FIG. 3b or vacuum tube shown in FIG. 3c. The OFICC isolates the nonlinearities of the output stage from the signal source, as will be pointed out more fully hereinafter. Once this is accomplished, it can be readily appreciated that nonlinearities of the output stages are reduced. In practice, 10 to 100 times improvement can be achieved in distortion reduction of the output stage with an OFICC coupling the signal source to its input terminal. The greatest effect is achieved in power amplifiers having a push-pull output stage.

Figure 4:
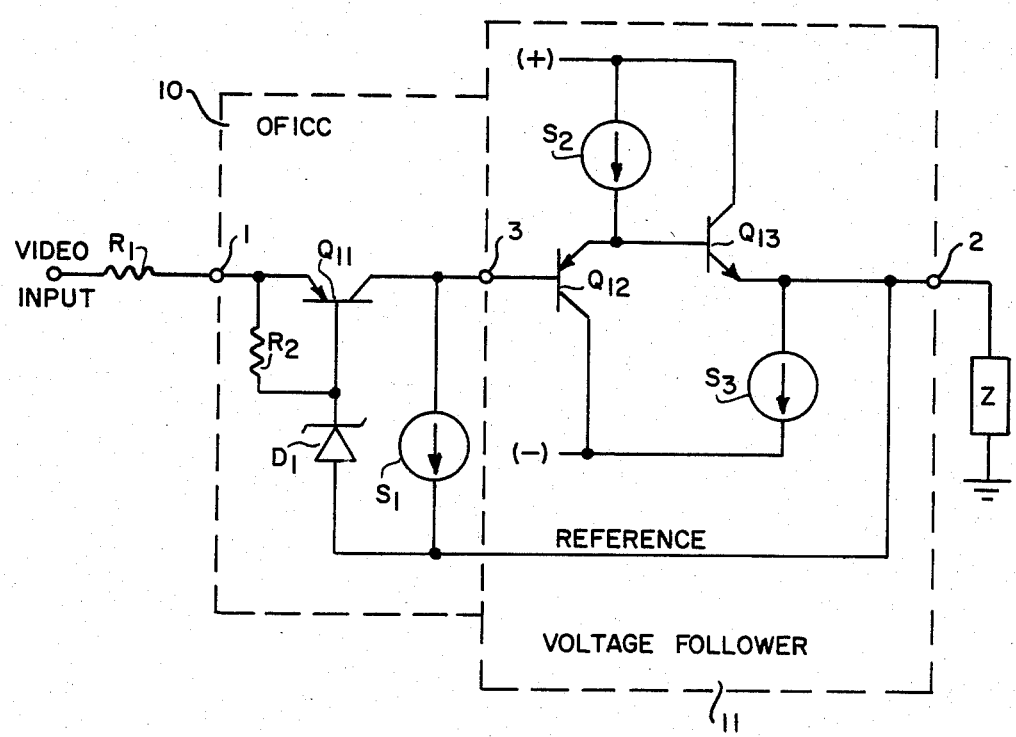
FIG. 4 illustrates an OFICC before a video line driver.

A simple example of the application of an OFICC is before a video line driver having a single-ended output stage, as shown in FIG. 4. The OFICC 10 is coupled to the video signal source by a resistor $R_1$, possibly required for stability of the OFICC and voltage follower 11 as a system. The OFICC is comprised of a bipolar transistor $Q_{11}$ to perform the function of the transconductance $g_m$ shown in FIG. 2, a resistor $R_2$ and Zener diode $D_1$ to reverse bias the collector-base junction of the transistor for its proper operation, and a current source $S_1$ to set the quiescent current bias for the transistor, thus defining its transconductance. The resistor $R_2$ has a current established by the base-emitter voltage drop of the transistor $Q_{11}$ which flows through the Zener diode, producing a relatively constant voltage drop across the Zener diode as required to allow the base of the transistor $Q_{11}$ to closely follow the output voltage of the voltage follower comprised of complementary transistors $Q_{12}$ and $Q_{13}$. The output of the voltage follower thus serves as a reference for the transistor $Q_{11}$ connected in a common-base configuration. The input voltage and current for the transistor $Q_{11}$ is provided through the resistor $R_1$.

The transistors $Q_{12}$ and $Q_{13}$ of the voltage follower 11 are each connected in emitter follower configuration. Using complementary transistors will cancel the base-emitter voltage drop through each transistor. The transistors are biased by current sources $S_2$ and $S_3$. The voltage follower has no negative feedback circuit, only internal feedback at each emitter-follower stage.

The reference port of the OFICC is connected to the output terminal 2 of the voltage follower. The system exhibits multiple pole response and may be unstable. These poles and the output terminating impedance Z can be modeled back to the input as an input impedance with a possible negative resistance term which can cause instability if not cancelled with positive resistance. Resistor $R_1$ provides this function, but degrades the improvement in performance otherwise achieved by using an OFICC.

In the case of a voltage follower with a simple single pole response, stability is assured and an effective bandwidth extension is achieved. This assumes the gain-bandwidth product of the OFICC is greater than that of the voltage follower. The gain-bandwidth of the OFICC is normally very high, approximately equal to the collector-emitter current gain-bandwidth product $f_T$ of the transistor, typically in the range of 50 to 700 MHz for bipolar junction transistors. The system is more linear with the OFICC until the slew rate limitation of the voltage follower is reached.

Figure 5:
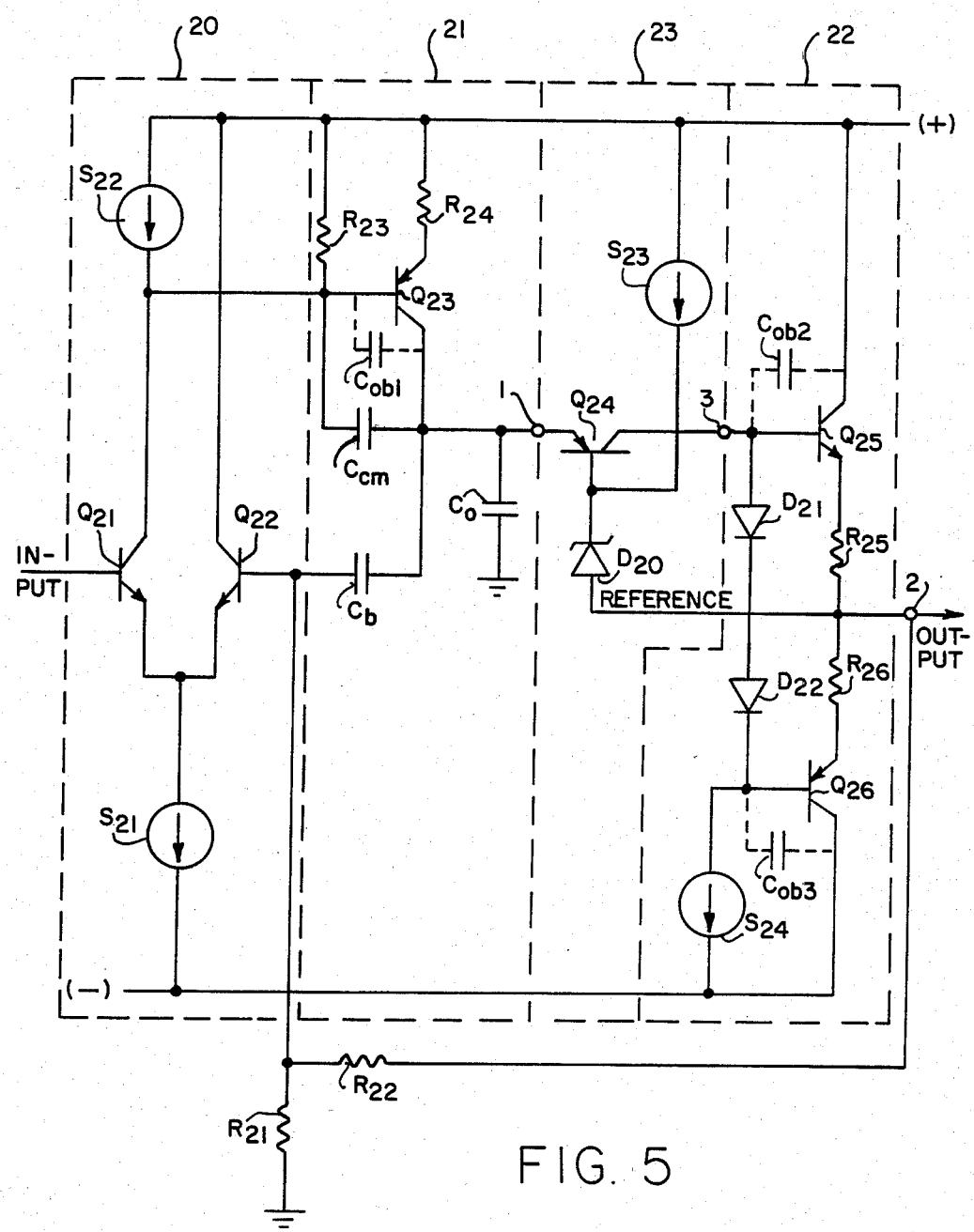
FIG. 5 illustrates an OFICC between an intermediate stage and an output stage of a typical audio power amplifier or operational amplifier.

A more beneficial application of the OFICC is shown in FIG. 5 comprised of a differential transconductance input stage 20, an intermediate stage 21, a push-pull output stage 22 and an OFICC 23 isolating the output stage from the intermediate stage 21. The latter is a current source, and the output stage is a voltage follower.

The differential transconductance input stage is comprised of transistors $Q_{21}$ and $Q_{22}$ biased by a current source $S_{21}$. The input signal is applied to the base of the transistor $Q_{21}$ and feedback signals are applied to the base of the transistor $Q_{22}$. The output signal taken from the collector of the transistor $Q_{21}$ biased by a current source $S_{22}$ is applied to a current and voltage gain transistor $Q_{23}$ in the intermediate stage with its transconductance set by resistor $R_{24}$ and its current gain set by resistors $R_{23}$ and $R_{24}$. The output of that stage is applied to the input of the OFICC comprised of a transistor $Q_{24}$. The output of the OFICC is applied to the input of a push-pull common-collector output stage comprised of complementary transistors $Q_{25}$ and $Q_{26}$ and thermal stabilizing resistors $R_{25}$ and $R_{26}$. The output terminal 2 of the output stage is connected to the reference port (REF) of the OFICC. Feedback from the output terminal 2 is also applied through a voltage dividing network $R_{21}$ and $R_{22}$ to the inverting input terminal of the differential input stage. This feedback network sets the voltage gain for the amplifier system. Bias for the transistor $Q_{23}$ of the intermediate stage is provided by resistors $R_{23}$ and $R_{24}$. Bias of the transistor $Q_{24}$ is provided by a current source $S_{23}$ and Zener diode $D_{20}$. Bias for the transistors $Q_{25}$ and $Q_{26}$ is provided by a current source $S_{24}$, diodes $D_{21}$ and $D_{22}$, and resistors $R_{25}$ and $R_{26}$.

Except for the OFICC isolating the intermediate stage 21 from the output stage 22, the circuit shown in FIG. 5 is a conventional amplifier widely used as an audio power amplifier or operational amplifier, sometimes with full push-pull implementation using a complementary differential input stage and intermediate stage to drive the second transistor $Q_{26}$, in which case a separate complementary OFICC is included between the separate intermediate stage and transistor $Q_{26}$. The design takes into consideration the internal Miller-effect capacitors of the transistor $Q_{23}$ and the internal device capacitances of $Q_{25}$ and $Q_{26}$ as shown as capacitors $C_{ob1}$, $C_{ob2}$ and $C_{ob3}$, respectively. Additional Miller compensation is provided by an external capacitor $C_{cm}$ connected between the base and collector of the transistor $Q_{23}$. This additional capacitance is provided as compensation to stabilize the amplifier system. Additional stability is provided by a feedback capacitor $C_b$ and an output lag capacitor $C_o$ at the output of the intermediate stage. The Miller compensation capacitances $C_{ob1}$ and $C_{cm}$, and the output lag capacitor $C_o$, produce a single pole response in this stage for a given bandwidth product. The feedback capacitor $C_b$ is a high frequency bypass for the output stage and permits an optimum Miller compensation capacitor $C_{cm}$ to be used.

Without the OFICC, all of this capacitance connected at the output of the intermediate stage would be connected directly to the input of the output stage. As a consequence, any nonlinearities of the output stage would feed back to the input stage and the intermediate stage, leading to greater nonlinearities in the output stage. The OFICC affects isolation of the compensation capacitors $C_o$ and $C_b$ and the Miller-effect capacitors $C_{ob1}$ and $C_{cm}$ from the voltage nonlinearities of the output stage to produce a more pure, distortionless output signal. The OFICC causes the voltage at the output of the current-source intermediate stage at terminal 1 to closely follow the output voltage of the output stage at terminal 2 as described.

The circuit of FIG. 5 can be analyzed and described by using the common technique previously alluded to which starts with an assumed perfect sinusoidal waveform at the output and looking back at each stage to see what distorted signal is required to produce the perfect sinusoidal signal at the output, given the distortion in each stage. The current-source nature of the intermediate stage would normally not be affected by the distorted voltage signal at the interface between the intermediate stage and the output stage, only by the current, assuming no OFICC. The compensation capacitors, however, would differentiate the distorted voltage into currents and couple these in such a way as to affect the intermediate stage, and thus require the input stage to have a distorted voltage waveform at its input, or to directly couple the distorted voltage to the input stage, as in the case of the feedback capacitor $C_b$. All of these distortions will affect a perfect sinusoidal signal at the input to produce a distorted waveform at the output.

Figure 6:
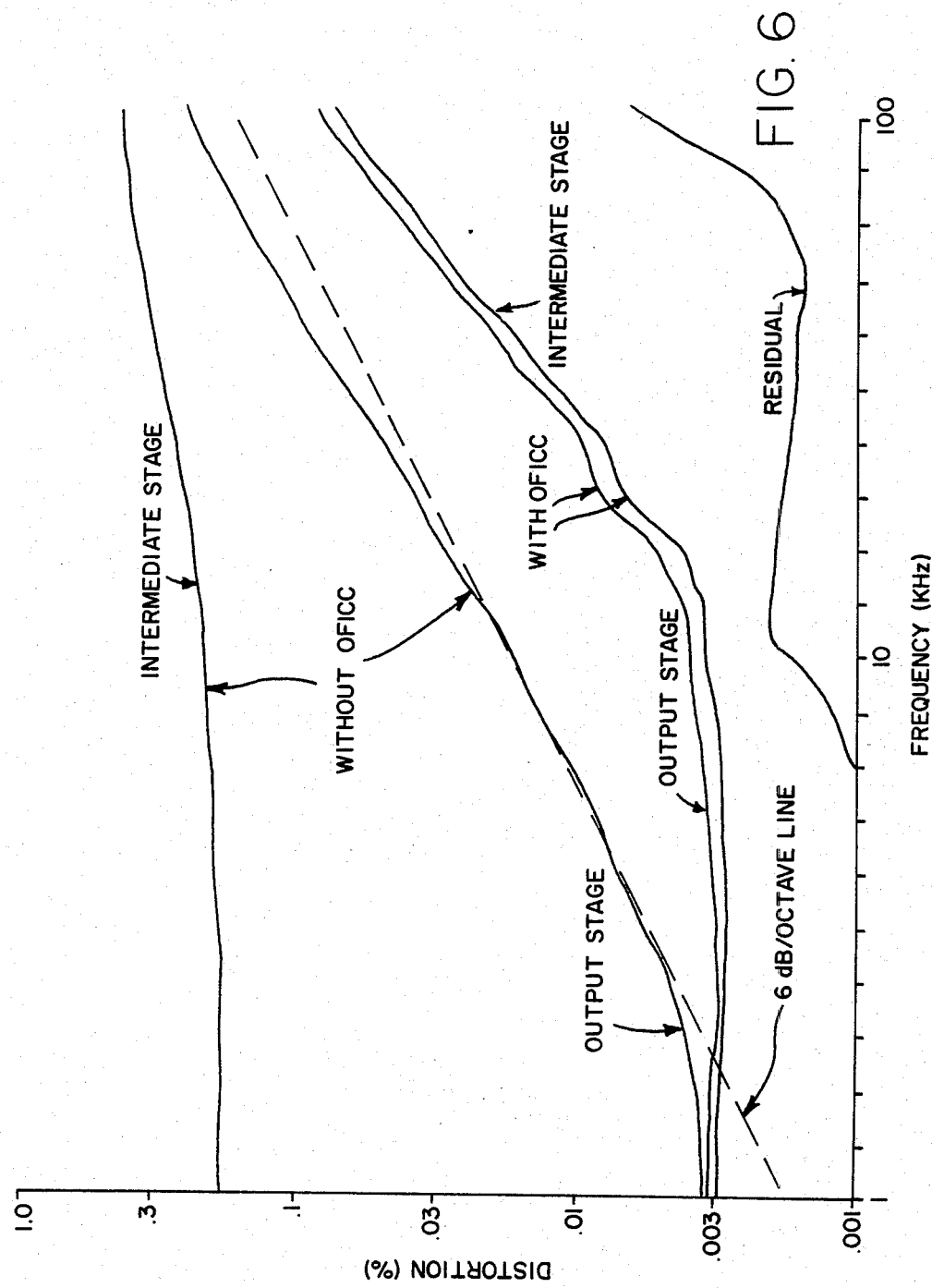
FIG. 6 is a graph of distortion as a function of frequency of an audio power amplifier with and without an OFICC between an intermediate stage and the voltage-follower output stage.

The OFICC isolates these capacitors at the output terminal of the intermediate stage from the distorted voltage at the input terminal 3 of the output stage required to produce a perfect sinusoidal waveform at the output terminal 2, given the distortion in the output stage. The OFICC thus prevents distortions from the output stage from affecting the input stage, or the intermediate stage, thus reducing the distortion of the amplifier system as shown in FIG. 6 which shows percent distortion for the intermediate stage and the output stage both without an OFICC and with an OFICC. The OFICC does not affect any distortions which take place within the output stage itself, which are differentiated into currents by the compensation produced by the output device capacitors $C_{ob2}$ and $C_{ob3}$. The OFICC does not prevent nonlinearities in current from passing from the intermediate stage to the output stage, so the current demands of the output device compensation capacitors $C_{ob2}$ and $C_{ob3}$ are satisfied. What the OFICC does is isolate the voltage at terminal 1 from the voltage at terminal 3 to prevent nonlinearities present at terminal 3 from affecting the preceding stages and compensation capacitors.

The OFICC can also perform a current limiting function for the output stage, thus protecting the output transistors from excessive output currents and power dissipation. For example, as more current is required through transistor $Q_{25}$ and resistor $R_{25}$, more voltage is dropped across the base-emitter junction of transistor $Q_{25}$ and resistor $R_{25}$. When this voltage reaches the level where the collector-base junction of the OFICC transistor $Q_{24}$ is no longer reverse biased, the current from the intermediate stage will flow through the biasing Zener diode $D_{20}$ and effectively limit the maximum voltage at the base of the transistor $Q_{25}$, and thus limit the current. This is effective with bipolar and MOSFET output stages.

An additional advantage of the OFICC is that bias required by the OFICC can be used to keep the output stage from saturating. This is of particular advantage in the case of power transistors in the output stage because of the time they require to bring them out of saturation.

Figure 7:
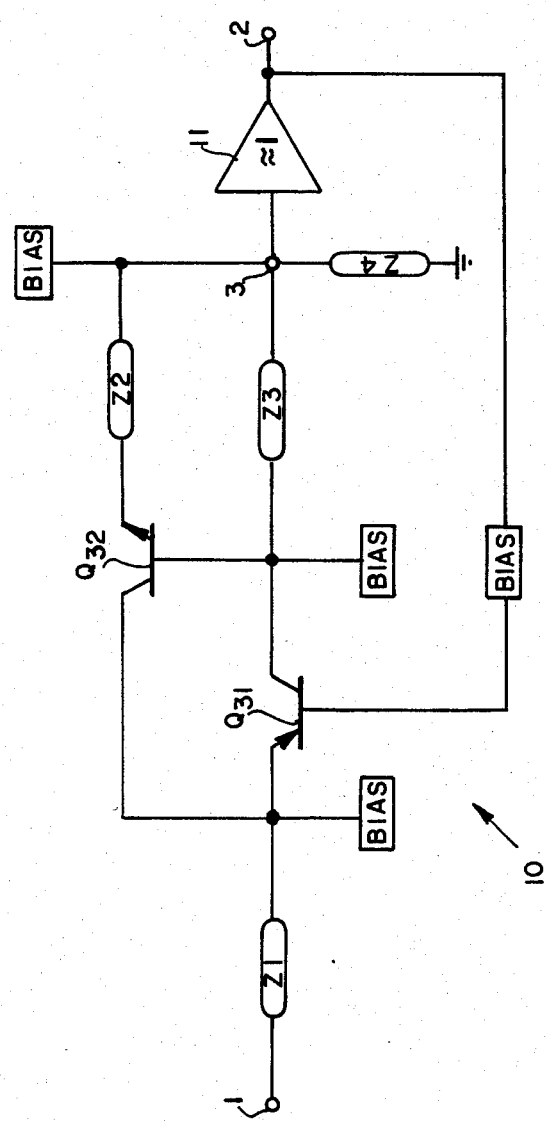
FIG. 7 illustrates an exemplary implementation for an OFICC using a multipole transconductance amplifier.

Although particular embodiments of the invention have been described and illustrated herein, it is recognized that modifications and variations may readily occur to those skilled in the art. For example, in place of a single transistor in the OFICC, it would be possible to use a Darlington pair, or a more complex multiple transistor circuit such as shown in FIG. 7 to provide a multipole transconductance amplifier in which the transconductance varies as a function of frequency. Referring to FIG. 7, transistor $Q_{31}$ is the main OFICC controlling transistor while the complementary transistor $Q_{32}$ provides the main signal current path to the voltage follower 11. Complex impedances Z1, Z2 and Z3 are designed to provide the desired transconductance $g_m$ as a function of frequency. A complex impedance Z4 at the input of the voltage follower is used as a terminating impedance to the OFICC to shape the input impedance $X_i$ for the voltage follower. Consequently, it is intended that the claims be interpreted to cover such modifications and equivalents.

What is claimed is:

1. A circuit combination for reducing nonlinear distortion comprising:
   signal source means having an output terminal;
   voltage follower output means having an input terminal and an output terminal;
   isolation circuit means having an input terminal and an output terminal and including a transconductance means having a control electrode;
   means connecting said signal source means output terminal to said isolation circuit means input terminal;
   means connecting said isolation circuit means output terminal to said output means input terminal; and
   means connecting said output means output terminal to said control electrode for controlling said isolation circuit means to draw a current from said signal source means and to supply a related circuit from said isolation circuit means to said output means input terminal.

2. The combination as defined in claim 1 wherein said isolation circuit means is comprised of a transistor having an emitter connected to the output terminal of said signal source means, a collector connected to said input terminal of said output means and a base connected to the output terminal of said output means.

3. The combination as defined in claim 1 wherein said isolation circuit means is comprised of a field-effect transistor having a source connected to the output terminal of said signal source means, a drain connected to said input terminal of said output means and a gate connected to the output terminal of said output means.

4. The combination as defined in claim 1 wherein said isolation circuit means is comprised of a vacuum tube having a cathode connected to the output terminal of said signal source means, a anode connected to said input terminal of said output means and a grid connected to the output terminal of said output means.

5. The combination as defined in claim 1 wherein said isolation circuit means is comprised of a multiple transistor circuit having an emitter of one transistor connected to the output terminal of said signal source means, an emitter of a second transistor complimentary to said one transistor connected to said input terminal of said output means and a base of said one transistor connected to the output terminal of said output means.

6. The combination as defined in claim 1 wherein said signal source means is comprised of a differential transconductance input stage and an intermediate stage connected in series, said intermediate stage having Miller-effect capacitance between the output and the input terminals thereof.

7. The combination as defined in claim 6 including additional capacitance provided between said output terminal and said input terminal of said intermediate stage for additional Miller compensation.

8. The combination as defined in claim 6 wherein said intermediate stage has feedback capacitance from the output terminal thereof to said input 9. The combination as defined in claim 6, 7 or 8 wherein said intermediate stage has output lag capacitance connected to the output terminal thereof.

10. The combination as defined in claim 7 wherein said intermediate stage has feedback capacitance from the output terminal thereof to said input stage.

* * * * *